(12) United States Patent
Higaki et al.

(10) Patent No.: US 12,453,031 B2
(45) Date of Patent: Oct. 21, 2025

(54) POWER CONVERSION DEVICE

(71) Applicant: Mitsubishi Electric Corporation, Tokyo (JP)

(72) Inventors: Yusuke Higaki, Tokyo (JP); Takushi Jimichi, Tokyo (JP); Kimiyuki Koyanagi, Tokyo (JP); Takuya Kajiyama, Tokyo (JP); Akito Nakayama, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 92 days.

(21) Appl. No.: 18/289,899

(22) PCT Filed: May 13, 2021

(86) PCT No.: PCT/JP2021/018146
§ 371 (c)(1),
(2) Date: Nov. 8, 2023

(87) PCT Pub. No.: WO2022/239170
PCT Pub. Date: Nov. 17, 2022

(65) Prior Publication Data
US 2024/0251519 A1    Jul. 25, 2024

(51) Int. Cl.
*H05K 7/14* (2006.01)
*H02M 3/00* (2006.01)

(52) U.S. Cl.
CPC ........ *H05K 7/14322* (2022.08); *H02M 3/003* (2021.05); *H05K 7/14329* (2022.08)

(58) Field of Classification Search
CPC ........... H05K 7/14322; H05K 7/14329; H05K 7/209; H02M 3/003; H02M 7/003;
(Continued)

(56) References Cited

U.S. PATENT DOCUMENTS 5,579,217 A * 11/1996 Deam ................. H01L 23/52
257/E23.141
5,623,399 A *  4/1997 Ishii .................. H05K 7/14329
363/141
(Continued)

FOREIGN PATENT DOCUMENTS

CN    208767982 U    4/2019
EP    2 482 438 A2    8/2012
(Continued)

OTHER PUBLICATIONS

International Search Report and Written Opinion mailed on Jun. 15, 2021, received for PCT Application PCT/JP2021/018146, filed on May 13, 2021, 8 pages including English Translation.
(Continued)

*Primary Examiner* — Imani N Hayman
*Assistant Examiner* — Theron S Milliser
(74) *Attorney, Agent, or Firm* — XSENSUS LLP

(57) ABSTRACT

Unit converters each comprises a capacitor, a switching element having a flat surface on one side, a P-pole connection conductor where a second terminal hole at one end for fixing an electrode corresponding to a P-pole of the switching element and a first terminal hole at the other end for fixing a terminal of the capacitor are formed, and an N-pole connection conductor where a second terminal hole at one end for fixing an electrode corresponding to a N-pole of the switching element and a first terminal hole at the other end for fixing a terminal of the capacitor are formed. The unit-converters each including the connection conductors arranged to overlap in the thickness direction with their insulation maintained make the cooling surfaces of the switching elements be opposed to each other with a cooling device therebetween.

20 Claims, 15 Drawing Sheets

(58) Field of Classification Search
CPC .............. H02M 7/4835; H02M 7/5387; H01L 23/3736; H01L 23/473; H01L 25/072; H01L 25/115
See application file for complete search history.

(56) References Cited

U.S. PATENT DOCUMENTS

| | | | |
|---|---|---|---|
| 6,021,060 A | 2/2000 | Tanaka et al. | |
| 6,259,617 B1* | 7/2001 | Wu | H02M 7/003 363/141 |
| 6,490,187 B2* | 12/2002 | Mori | H02M 5/4585 363/147 |
| 7,798,833 B2* | 9/2010 | Holbrook | H05K 7/14329 361/679.01 |
| 7,881,086 B2* | 2/2011 | Nakayama | H02M 7/487 363/141 |
| 9,030,822 B2* | 5/2015 | Sharaf | H02M 7/493 174/15.1 |
| 9,042,147 B2* | 5/2015 | Ishii | H02M 7/003 361/677 |
| 9,219,425 B2* | 12/2015 | Sano | H02M 7/003 |
| 9,345,150 B2* | 5/2016 | Fukumasu | H05K 5/0026 |
| 9,585,292 B2* | 2/2017 | Horiuchi | H05K 7/2089 |
| 9,774,247 B2* | 9/2017 | Sharaf | H02M 7/493 |
| 10,153,708 B2* | 12/2018 | Maruyama | H02M 7/003 |
| 10,321,585 B2* | 6/2019 | Nakatsu | H01L 25/16 |
| 10,973,090 B2* | 4/2021 | Kanai | H02M 7/5387 |
| 2002/0034089 A1* | 3/2002 | Mori | H02M 7/003 363/147 |
| 2009/0219696 A1* | 9/2009 | Nakayama | H02M 7/003 361/709 |
| 2010/0178813 A1* | 7/2010 | Holbrook | H05K 7/14329 439/775 |
| 2012/0044640 A1 | 2/2012 | Harada et al. | |
| 2012/0188712 A1 | 7/2012 | Ishibashi et al. | |
| 2013/0044434 A1* | 2/2013 | Sharaf | H02M 7/003 361/702 |
| 2013/0265808 A1* | 10/2013 | Ishii | H02M 1/12 363/97 |
| 2013/0272043 A1* | 10/2013 | Sano | B60L 3/003 363/123 |
| 2013/0294040 A1* | 11/2013 | Fukumasu | H02K 11/33 361/752 |
| 2015/0138689 A1* | 5/2015 | Sharaf | H01G 4/228 361/301.2 |
| 2015/0382501 A1* | 12/2015 | Horiuchi | H05K 7/2089 363/131 |
| 2016/0165759 A1 | 6/2016 | Buschendorf et al. | |
| 2016/0261178 A1 | 9/2016 | Sato et al. | |
| 2016/0344301 A1* | 11/2016 | Maruyama | H01L 25/18 |
| 2019/0008001 A1* | 1/2019 | Kanai | H05B 6/04 |
| 2019/0098777 A1* | 3/2019 | Nakatsu | H02M 7/003 |
| 2019/0254182 A1* | 8/2019 | Nakatsu | H01L 23/3735 |

FOREIGN PATENT DOCUMENTS

| | | |
|---|---|---|
| EP | 3203625 A1 | 8/2017 |
| EP | 3 579 396 A1 | 12/2019 |
| JP | 10-201249 A | 7/1998 |
| JP | 2008-245451 A | 10/2008 |
| JP | 2014-158349 A | 8/2014 |
| JP | 2015-115974 A | 6/2015 |
| JP | 2016-524454 A | 8/2016 |
| WO | 2015/037537 A1 | 3/2015 |

OTHER PUBLICATIONS

Extended European Search Report issued Feb. 20, 2024, in corresponding European Patent Application No. 21941904.1, 8 pages.
European Office Action issued Sep. 2, 2025 in Patent Application No. 21 941 904.1, 6pp.

* cited by examiner

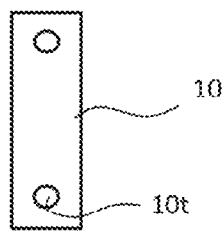
FIG. 8A
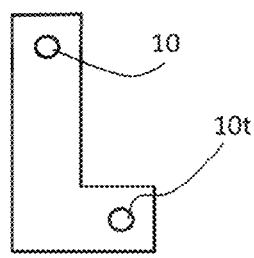 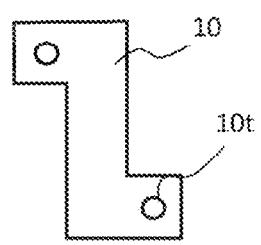
FIG. 8B          FIG. 8C

POWER CONVERSION DEVICE

CROSS-REFERENCE TO RELATED APPLICATION

This application is based on PCT filing PCT/JP2021/018146, filed May 13, 2021, the entire contents of which are incorporated herein by reference.

TECHNICAL FIELD

The present application relates to a power conversion device.

BACKGROUND ART

As a power conversion device used for DC power transmission or the like, a modular multilevel converter (hereinafter referred to as MMC) is known. MMC is a power conversion device including a plurality of unit-converters, each of which includes a pair of switching elements, such as an insulated gate bipolar transistor (IGBT) or a metal oxide semiconductor field effect transistor (MOSFET), and a DC capacitor.

In addition, a multi-level power conversion device is known for use in a distributed power supply and a motor drive. Even in the multi-level power conversion device, there is a case where the multi-level power conversion device is composed of a plurality of unit-converters, and a power conversion device has been proposed, aiming to equalize duties of a plurality of DC capacitors (for example, refer to Patent Document 1).

CITATION LIST

Patent Document

Patent Document 1: Japanese Patent Application Laid-Open No. 2015-115974 (paragraphs 0011 to 0022, FIG. 1 to FIG. 3)

SUMMARY OF INVENTION

Problems to be Solved by Invention

On the other hand, in a power conversion device used for DC power transmission or the like, a high voltage and a large current are often handled, and a switching element, a DC capacitor, and wiring are increased in size, and a structure supporting these components is also increased in size. Therefore, in the power conversion device used for DC power transmission or the like, size reduction thereof is an important issue.

The present application discloses a technique for solving the above-described problem, and an object of the present application is to obtain a compact power conversion device used for DC power transmission or the like.

Means for Solving Problems

A power conversion device disclosed in the present application includes a pair of unit-converters, and a cooling device. Each of the pair of unit-converters includes a capacitor, a switching element in which a cooling surface and a connecting surface opposite to the cooling surface are provided and two electrodes through which main power flows are formed in the connecting surface and by which a leg for power conversion is formed by forming a pair, a first conductive plate in which a second terminal hole is formed at one end for fixing an electrode of the switching elements forming the pair, the electrode corresponding to a first pole in the leg, and a first terminal hole is formed at the other end for fixing an electrode of the capacitor corresponding to the first pole, and a second conductive plate in which a second terminal hole is formed at one end for fixing an electrode of the switching elements forming the pair, the electrode corresponding to a second pole in the leg, and a first terminal hole is formed at the other end for fixing an electrode of the capacitor corresponding to the second pole, the second conductive plate being arranged to overlap with the first conductive plate in a thickness direction, maintaining insulation from the first conductive plate. In the pair of unit-converters, the cooling surfaces of the switching elements forming the pair in one unit-converter is opposed to the cooling surfaces of the switching elements forming the pair in the other unit-converter with the cooling device interposed therebetween.

Advantageous Effect of Invention

According to the power conversion device disclosed in the present application, since the power conversion device can be configured by sharing the cooling device of the switching element, the number of components is reduced, and a compact power conversion device used for DC power transmission or the like can be obtained.

BRIEF DESCRIPTION OF THE DRAWINGS

FIG. 8A to FIG. 8C each are a plan view of a wiring member having a different shape for electrical connection between the unit-converters in the power conversion device according to Embodiment 1.

MODE FOR CARRYING OUT INVENTION

Embodiment 1

Figure 1A:
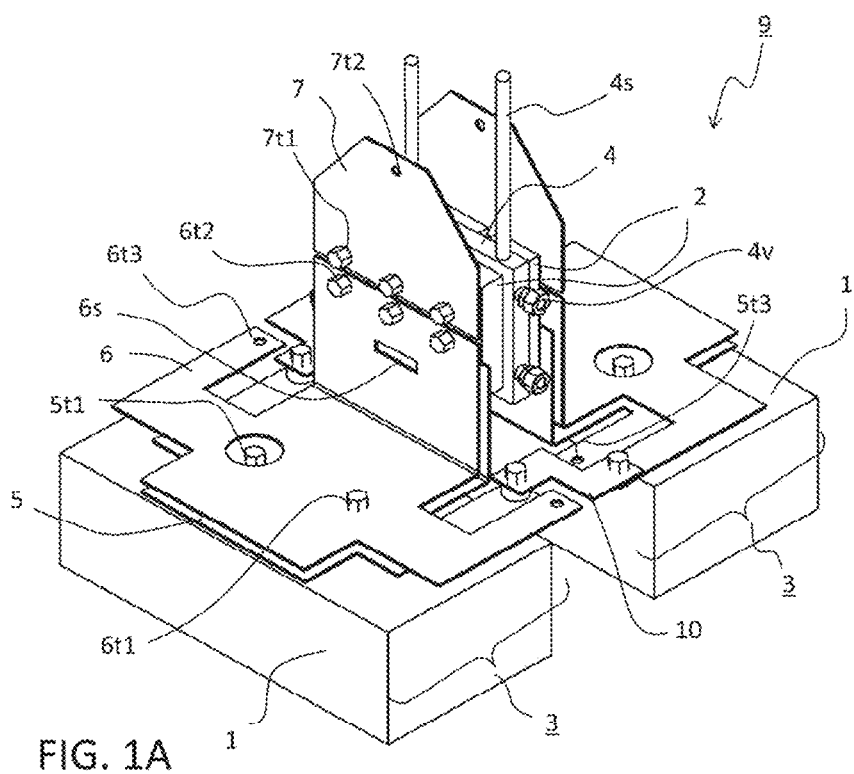
FIG. 1A and FIG. 1B are a perspective view for describing a configuration of a power conversion device according to Embodiment 1 and a circuit diagram showing a configuration of an unit-converter, respectively.
Figure 1B:
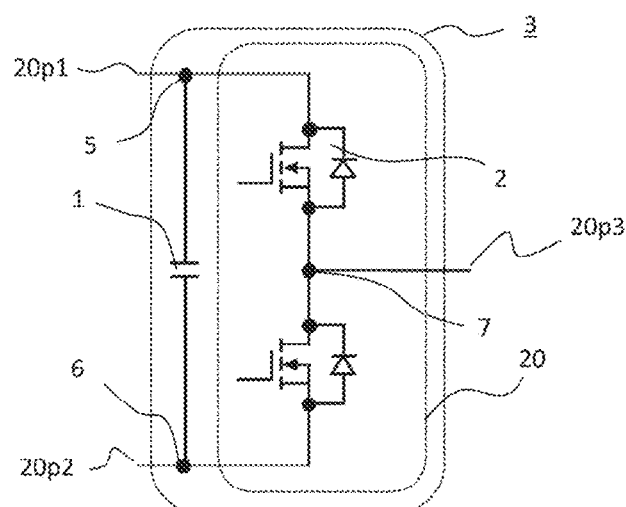
Figure 2:
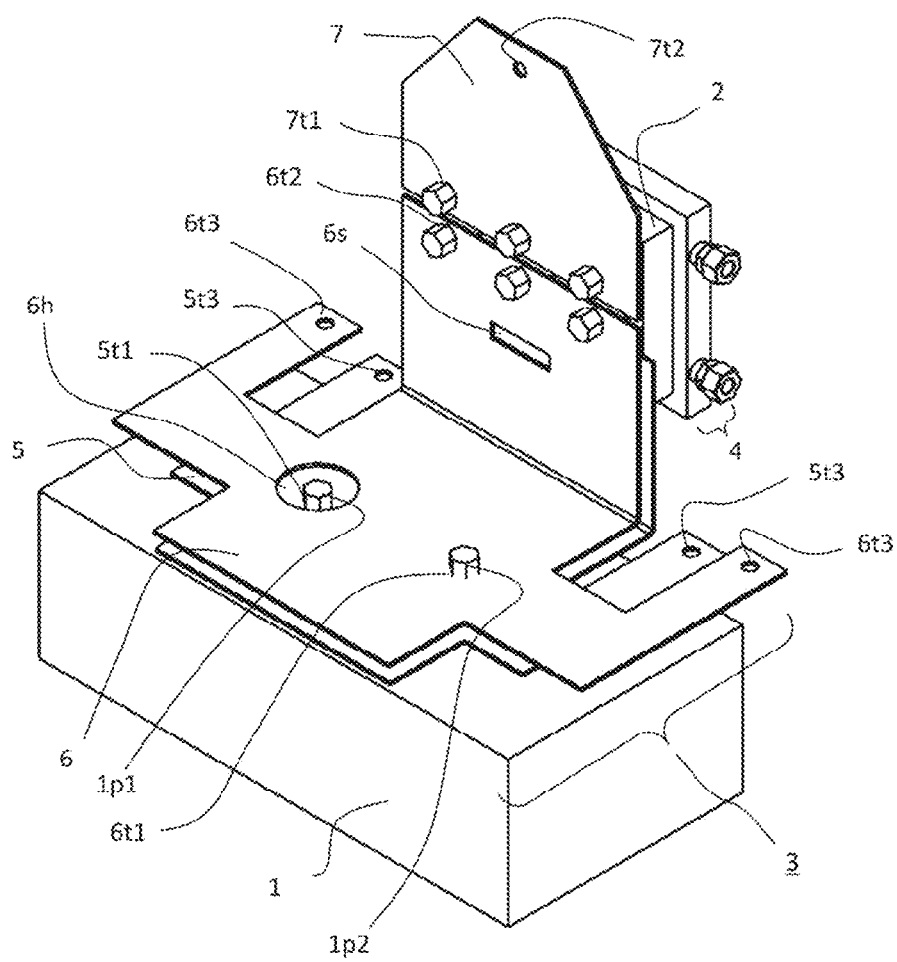
FIG. 2 is a perspective view for describing the configuration of the unit-converter of the power conversion device according to Embodiment 1.

FIG. 1A to FIG. 8C are for describing a configuration and an operation of the power conversion device according to Embodiment 1, and FIG. 1A is a perspective view showing the configuration of the power conversion device when viewed obliquely from above, FIG. 1B is a circuit diagram showing a configuration of an unit-converter, and FIG. 2 is a perspective view showing the unit-converter when viewed obliquely from above. FIG. 3A is a perspective view showing a structure of a P-pole connection conductor in FIG. 2 that is turned upside down, and FIG. 3B is a perspective view showing a structure of an N-pole connection conductor in FIG. 2 that is turned upside down.

Figure 4:
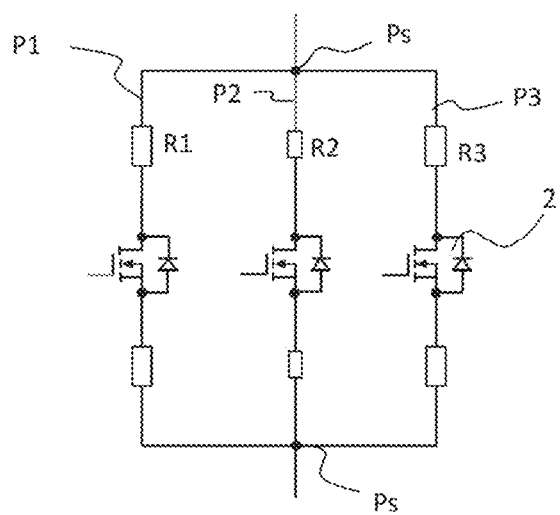
FIG. 4 is a circuit diagram showing a configuration of legs in which three switching elements are connected in parallel in the power conversion device according to Embodiment 1.
Figure 5A:
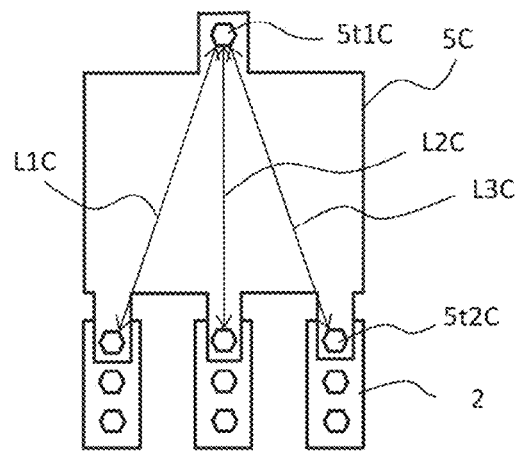
FIG. 5A and FIG. 5B are schematic diagrams of P-pole connection conductor portions for describing wiring lengths for the switching elements connected in parallel in power conversion devices according to a comparative example and Embodiment 1, respectively.
Figure 5B:
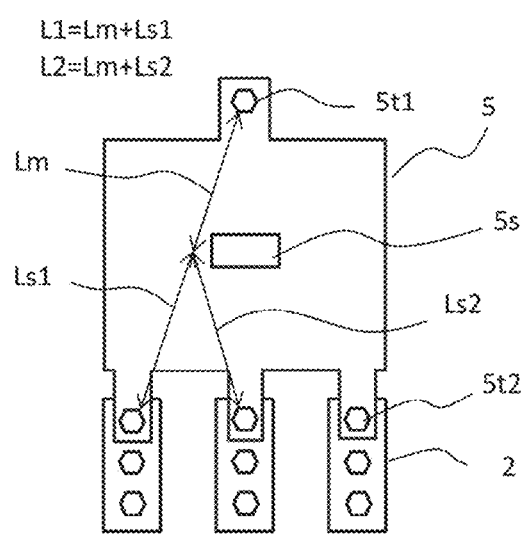
Figure 6:
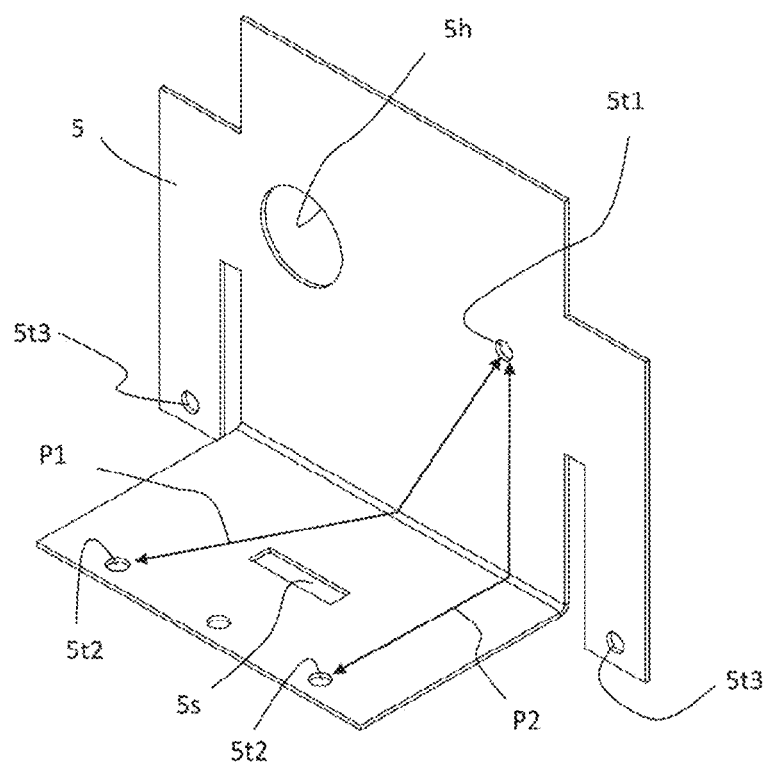
FIG. 6 is a perspective view of the P-pole connection conductor for describing a terminal position for electrical connection with a capacitor in the power conversion device according to Embodiment 1.

FIG. 4 is a circuit diagram showing a configuration of legs in which three switching elements are connected in parallel, FIG. 5A is a schematic diagram of a P-pole connection conductor portion for describing wiring lengths for switching elements connected in parallel in a power conversion device according to a comparative example, and FIG. 5B is a schematic diagram of the P-pole connection conductor portion for describing wiring lengths for switching elements connected in parallel in the power conversion device according to Embodiment 1. Further, FIG. 6 is a perspective view corresponding to FIG. 3A of the P-pole connection conductor for describing positions of terminals for electrical connection to a capacitor.

Figure 7A:
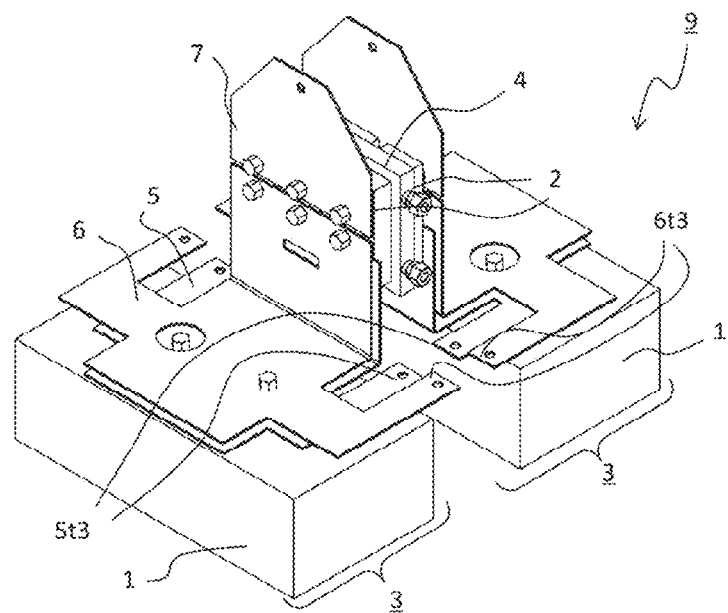
FIG. 7A and FIG. 7B are a perspective view and a plan view of the power conversion device for describing electrical connection between the unit-converters in the power conversion device according to Embodiment 1, respectively.
Figure 7B:
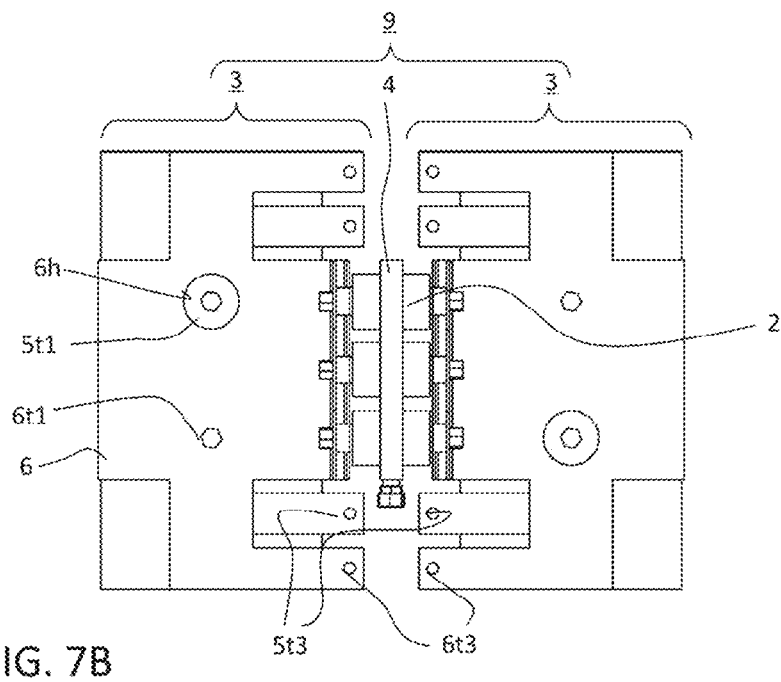

On the other hand, FIG. 7A is a perspective view of the power conversion device corresponding to FIG. 1A for describing electrical connection between the unit-converters, and FIG. 7B is a plan view when it is viewed from above. In addition, FIG. 8A to FIG. 8C are plan views of connection objects for electrically connecting the unit-converters to each other or wiring members having different shapes.

The power conversion device disclosed in the present application is used for DC power transmission and is assumed to be an MMC system to be described later in detail in Embodiment 3. As shown in FIG. 1A, the power conversion device 9 is configured such that a cooling device 4 is interposed between the two unit-converters 3 (details will be described later). The unit-converter 3 is constituted by a capacitor 1 as a power storage element and two or more switching elements 2. Here, prior to the description of a characteristic configuration of the present application, a basic configuration as a premise will be described.

More specifically, as shown in FIG. 1B, the unit-converter 3 is constituted by a half-bridge circuit by a leg 20 in which two or more switching elements 2 are connected in series and a capacitor 1 is connected in parallel to the leg 20. Here, the middle of the leg 20 in which two or more switching elements 2 are connected in series is an AC-pole 20p3. One end of the leg 20 serves as a P-pole 20p1, and the other end opposite to the P-pole 20p1 serves as an N-pole 20p2. A drain terminal or a collector terminal of the switching element 2 is connected to the P-pole 20p1. A source terminal or an emitter terminal of the switching element 2 is connected to the N-pole 20p2.

As the capacitor 1, various power storage elements such as a film capacitor, an electrolytic capacitor, and an electric double-layer capacitor can be applied. Various semiconductor elements such as an insulated gate bipolar transistor (IGBT) and a metal oxide semiconductor field effect transistor (MOSFET) can be applied to the switching element 2. However, the present application is not directed to the press-packed semiconductor element disclosed in Patent Document 1 in which electrodes through which electric power flows are separately formed on both surfaces, but is directed to the switching element 2 in which two electrodes through which electric power flows are formed by dividing a region in one surface in a package to be described later. A form in which the electrode, for example, can be mechanically fixed and electrically connected by a bolt or the like, such as a screw hole over the surface of an insulating package, is assumed.

Here, in order to actually form the unit-converter 3 described with reference to FIG. 1B, in addition to the element constituting the half-bridge circuit, the P-pole connection conductor 5 serving as P-pole wiring, the N-pole connection conductor 6 serving as N-pole wiring, an AC-pole connection conductor 7 serving as AC-pole wiring, and a cooling device 4 for cooling the switching element 2 are required.

When assembling of the element constituting the half-bridge circuit is performed together with metal plates used for the conductors such as the P-pole connection conductor 5, the N-pole connection conductor 6, and the AC-pole connection conductor 7, and a thick plate-shaped cooling device 4, the unit-converter 3 as shown in FIG. 2 can be structured. In FIG. 2, three legs 20 are connected in parallel to each other (refer to FIG. 4). In FIG. 1B, a 2-in-1 package in which two switching elements 2 are integrated is assumed, and a package forming the leg 20 is drawn as a single switching element 2, but this is not a limitation. For example, two 1-in-1 packages each including the single switching element 2 may be arranged in the series connection direction to constitute the leg 20, and then three legs 20 may be arranged in the parallel connection direction.

Note that, as the cooling device 4, an example of a structure assuming a water-cooled fin is shown, and the cooling device 4 is provided with a water-cooled valve port 4v, which is an inlet and an outlet of refrigerant, and is supported by a structural component 4s. The structural component 4s is connected and fixed to a housing (not shown) in which the unit-converter 3 is built in. Although not described in detail in the present application, if necessary, the capacitor 1 and various conductors are also fixed to the housing by some structural parts such as bolts and metal fittings.

Figure 3A:
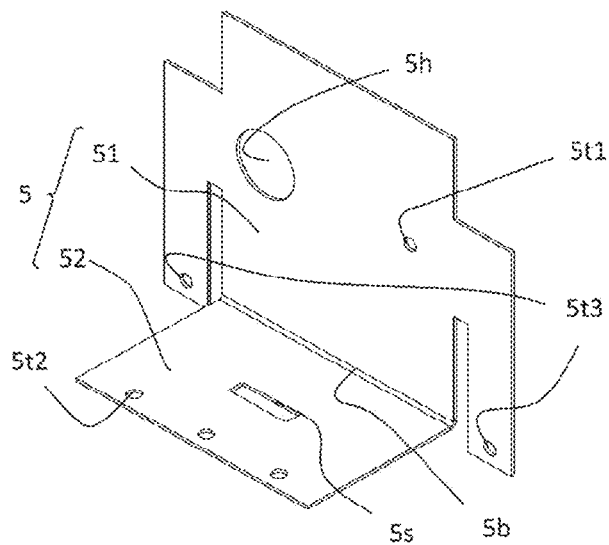
FIG. 3A and FIG. 3B are perspective views showing structures of a P-pole connection conductor and an N-pole connection conductor of the power conversion device according to Embodiment 1, respectively.
Figure 3B:
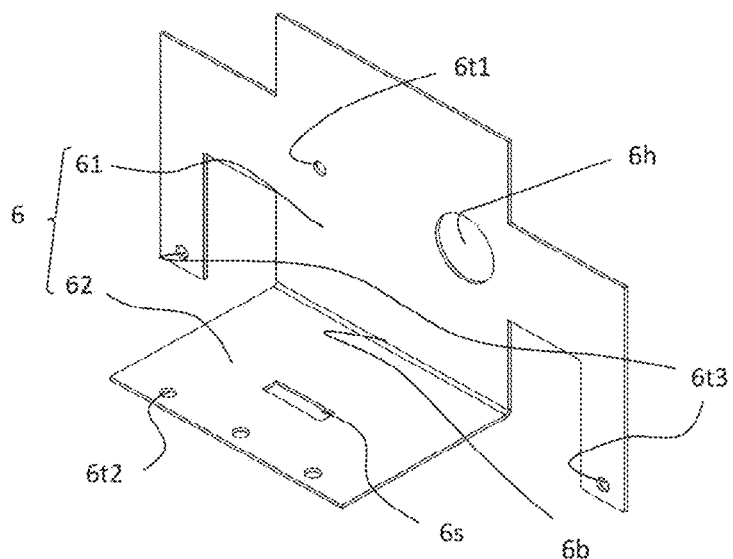

The P-pole connection conductor 5 and the N-pole connection conductor 6 are arranged to overlap each other in the thickness direction. However, a certain gap or an insulating member is provided between the P-pole connection conductor 5 and the N-pole connection conductor 6, and they are electrically separated from each other. In addition, the capacitor 1 includes a P-pole terminal 1$p$1 and an N-pole terminal 1$p$2. The P-pole terminal 1$p$1 and the N-pole terminal 1$p$2 of the capacitor 1 are provided on the same surface of the capacitor 1. A first terminal hole 5$t$1 formed at one end of the P-pole connection conductor 5 shown in FIG. 3A and a first terminal hole 6$t$1 formed at one end of the N-pole connection conductor 6 shown in FIG. 3B are fixed to the surface by a mechanism such as a bolt. In order to avoid interference between the terminal 1$p$1 and the terminal 1$p$2, the P-pole connection conductor 5 and the N-pole connection conductor 6 are formed with through holes 5$h$ and 6$h$ in alignment with the positions of the first terminal hole 6$t$1 of the N-pole connection conductor 6 and the first terminal hole 5$t$1 of the P-pole connection conductor 5, respectively.

Second terminal holes 5$t$2 (hidden and invisible in FIG. 2) formed at an end portion of the P-pole connection conductor 5 on the opposite side to the first terminal hole 5$t$1 in the plane are connected to the P-poles 20$p$1 of the legs 20 by a mechanism such as a bolt. Second terminal holes 6$t$2 formed at an end portion of the N-pole connection conductor 6 on the opposite side to the first terminal hole 611 in the plane are connected to the N-poles 20$p$2 of the legs 20 by a mechanism such as a bolt.

Note that, in FIG. 2, three bolts that are not denoted by reference numerals at the connection points between the N-pole connection conductor 6 and the legs 20 correspond to the respective three legs 20. Similarly, there are three bolts at the connection points between the P-pole connection conductor 5 and the P-poles 20$p$1 of the legs 20, but these bolts are hidden by the N-pole connection conductor 6 and cannot be seen. The P-pole connection conductor 5 is bent by an angle of 90 degrees at the middle portion (bent portion 5$b$) between the first terminal hole 5$t$1 and the second terminal holes 5$t$2. The N-pole connection conductor 6 is also bent by an angle of 90 degrees at the middle portion (bent portion 6$b$) between the first terminal hole 6$t$1 and the second terminal holes 6$t$2. The reason to have the bent portions will be described later.

Further, the P-pole connection conductor 5 is provided with third terminal holes 5$t$3 at positions different from the first terminal hole 5$t$1 and the second terminal holes 5$t$2 (details will be described later), and the third terminal holes are used for connection between the unit-converter 3 and the outside. Similarly, the N-pole connection conductor 6 is provided with third terminal holes 6$t$3 at positions different from the first terminal hole 6$t$1 and the second terminal holes 6$t$2, and the third terminal holes are used for connection between the unit-converter 3 and the outside.

First terminal holes 7$t$1 provided at one end of the AC-pole connection conductor 7 are connected to the AC-poles 20$p$3 of the legs 20 by a mechanism such as a bolt, and the three bolts at connection points between the AC-pole connection conductor 7 and the legs 20 correspond to the respective three legs 20. A second contact hole 7$t$2 of the AC-pole connection conductor 7, which is located at an end portion opposite to the first terminal holes 7$t$1 in the plane, is connected to the outside of the unit-converter 3 and used as an input/output terminal.

The switching element 2, including the 2-in-1 package, has a plate shape, and electrodes to be connected to various conductors (the P-pole connection conductor 5, the N-pole connection conductor 6, and the AC-pole connection conductor 7) are formed in separate regions on one of the two main surfaces. Although it is described that the P-pole connection conductor 5 and the N-pole connection conductor 6 are bent by 90 degrees in the middle, it is a simple example that the P-pole connection conductor 5 and the N-pole connection conductor 6 are bent by an angle of 90 degrees. The angle is not necessarily 90 degrees and may be another angle as in a variation example to be described later. As an extreme example, in a case where the thickness of the capacitor 1 is equal to or less than the thickness of the switching element 2, the P-pole connection conductor 5 and the N-pole connection conductor 6 do not need to be bent in the middle for the reason to be described later.

The surface of the switching element 2 opposite to the surface on which various electrodes are provided is flat and is used as a cooling surface without electrical connection. When the switching element 2 is energized, various losses such as a switching loss and a conduction loss occur, which causes a temperature rise of the switching element 2. The temperature rise of the switching element 2 causes a decrease in the performance of the switching element 2 or a failure of the switching element 2, and thus needs to be suppressed.

Therefore, in order to suppress the temperature rise of the switching element 2, the unit-converter 3 is provided with the cooling device 4. The cooling device 4 needs to have a cooling capability to deal with the amount of heat generated owing to the loss that occur in the switching element 2. As an index of the cooling capability, for example, thermal resistance (K/W) is used, which represents a temperature difference (K) necessary for heat transfer per 1 watt (W), and as the thermal resistance is smaller, heat transfer can be performed with a smaller temperature difference, that is, the reaching temperature of a cooling target can be suppressed to be low.

On the premise of the above-described basic configuration, a characteristic part of the power conversion device 9 of the present application configured such that two unit-converters 3 share one cooling device 4 will be described. In the power conversion device 9 using the two unit-converters 3, the two unit-converters 3 are arranged so as to be opposed to each other as shown in FIG. 1A. At this time, the cooling surface of the switching element 2 in each of the unit-converters 3 is arranged such that they are opposed to each other. By disposing the two unit-converters 3 so as to be opposed to each other in this manner, the cooling device 4, which is originally required to be provided for the respective unit-converters 3, can be unified (shared).

Here, for the unification of the cooling device 4 provided for each of the unit-converters 3, the cooling surfaces of the switching elements 2 or of the packages in the unit-converters 3 need to be placed close to each other. Therefore, among the components constituting the unit-converter 3, a component exceeding the height of the switching element 2 or the package needs to be disposed in a direction different from that of the switching element 2.

For example, in the unit-converter 3 shown in FIG. 2, the capacitor 1 has a higher mounting height than the switching element 2. Therefore, the P-pole connection conductor 5 and the N-pole connection conductor 6 are bent by 90 degrees at the middle portions (bent portion 5$b$ and bent portion 6$b$) between the region connected to the switching element 2 and the region connected to the capacitor 1. The mounting direction of the switching element 2 (horizontal direction in the figure) is different from the mounting direction of the capacitor 1 (vertical direction in the figure) by 90 degrees. As a result, with respect to the two unit-converters 3, the cooling surfaces of the respective switching elements 2 can be brought close to and opposed to each other.

As described above, the bent portion 5b and the bent portion 6b are required when there are a component exceeding the height of the switching element 2 or the package among the components constituting the unit-converter 3. Therefore, when the capacitor 1 does not exceed the height of the switching element 2, it is not necessary to bend the P-pole connection conductor 5 and the N-pole connection conductor 6 in the middle. Accordingly, the P-pole connection conductor 5 and the N-pole connection conductor 6 may be flat plates that are not bent. In addition, the switching element 2 may be connected to one side in the surfaces of the P-pole connection conductor 5 and the N-pole connection conductor 6, and the capacitor 1 may be connected to the other side in the surfaces opposite to the one side. In such an arrangement, the P-pole connection conductor 5 and the N-pole connection conductor 6 do not need to be bent even when the capacitor 1 is larger in mounting height than the switching element 2.

On the other hand, the cooling device 4 shared by the two unit-converters 3 is required to have the cooling capability corresponding to the amount of heat generated by the switching elements 2 of the two unit-converters 3. Compared with a case where an independent cooling device 4 is provided for each of the unit-converters 3, in the cooling device 4 unified in the two unit-converters 3, it is necessary to cool down the temperature rise caused by the loss that is twice as much in a simple calculation. When the cooling device 4 is an air-cooled fin, the thermal resistance thereof may be reduced by increasing the amount of air or changing the shape of the fin.

When the cooling device 4 is a water-cooled fin, the thermal resistance thereof may be reduced by improving the thermal conductivity by changing the composition of the cooling water in addition to the increase in the flow rate, the change in the fin shape, or the like. An example of a method for improving the thermal conductivity of the cooling water is to utilize the fact that the thermal conductivity typically depends on the temperature. By using cooling water having a composition in which the thermal conductivity increases as the cooling water temperature increases, when the amount of heat generation increases and the cooling water temperature increases, it is possible to compensate for the decrease in the temperature difference to maintain the cooling capability.

The cooling device 4 used in the unit-converter 3 according to Embodiment 1 is illustrated, assuming the water-cooled fin. In the case of improving the cooling capability of the cooling device 4, it is not always necessary to increase the size of the outer shape of the cooling device 4 itself as long as the cooling capability is improved by the conditions of the refrigerant such as the cooling air and the cooling liquid. Then, the outer shape of the cooling device 4 unified in the two unit-converters 3 is not always necessary to be changed from that of the one independent cooling device provided for each unit-converter 3.

Therefore, in the power conversion device 9 of the present application, the cooling device 4 having the same outer shape as the cooling device having the specifications provided for each of the unit-converters 3 as originally intended is used, and one cooling device 4 is installed for the two unit-converters 3. Accordingly, the number of cooling devices installed on the power conversion device 9 can be reduced by half. Note that, in a case where the press-packed semiconductor element described in Patent Document 1 is used, it is necessary to install cooling devices on both sides of the semiconductor element, and even if one cooling device is shared between the unit-converters, it is necessary to further install cooling devices in accordance with the number of the elements and use at least three cooling devices. In other words, more cooling devices than the number of unit-converters are required.

As a material of the cooling device, typically, aluminum (Al), copper (Cu), or an alloy mainly containing these is often used. When copper is used, the cooling capability is excellent, but the weight tends to be high, and when aluminum is used, the weight is lower than that of copper. In order to incorporate such a cooling device 4 into the power conversion device 9, the structural component 4s for fixing is required. The structural component 4s is, for example, a metal framework (frame), and is connected and fixed to a housing (not shown) in which the power conversion device 9 is built in.

As the housing, for example, a rectangular parallelepiped box made of metal or resin is used. The thickness and strength of the structural component 4s need to be adjusted in accordance with weights of objects to be supported, and the number of structural components needs to be increased in accordance with the number of the objects to be supported. Therefore, halving the weight and the number of the cooling devices 4 not only means the reduction of the number of the cooling devices 4, but also obtains the effect of reducing the number of structural components 4s.

Opening

In the above configuration, the wiring lengths in a case where a plurality of switching elements 2 are connected in parallel will be described. The switching element 2 is plate-shaped, in which two electrodes for passing a current as a half bridge are formed in separate regions on one side. For example, a semiconductor chip is sealed in a resin case having a rectangular parallelepiped shape, and electrodes for connection are provided on it's upper surface. The number of switching elements 2 connected in parallel and used in the power conversion device 9 may be changed in accordance with the rated current of the power conversion device 9.

When a desired current can be reached by using one switching element 2 for the rated current of the power conversion device 9, one or more switching elements 2 are used. For the rated current of the power conversion device 9, for example, when the desired current can be eventually reached by using three switching elements 2, three or more switching elements 2 are used.

A problem related to the wiring lengths in the case where the switching elements 2 are connected in parallel as described above will be described. The magnitude of the current flowing through the switching elements 2 changes depending on the case of the current flow in the switching elements 2 and the ease of the current flow in the path through which the current flows. In the plurality of switching elements 2 connected in parallel, the magnitude of the current flowing through each of the switching elements 2 varies depending on the variation in the ease of the current flow in each switching element 2 and the variation in the ease of the current flow in each current path.

For example, as shown in FIG. 4, a case where three switching elements 2 are connected in parallel will be examined. In the case above, when a current easily flows in a case where an impedance R2 of a current path P2 of the switching element 2 located at the center is smaller than impedances R1 and R3 of the other current paths P1 and P3, the current concentrates on the switching element 2 located at the center. For example, the situation above corresponds to a case where wiring is performed for each switching element 2 at the current paths P1 to P3 divided into three at the branch point Ps for the respective three switching elements 2 arranged side by side. In this case, the length of the wiring required for the current path P2 of the central switching element 2 is physically shorter than the length of the wiring required for the current paths P1 and P3 of the switching elements 2 on both sides. As a result, the impedances R1 and R3 are larger than the impedance R2.

On the other hand, in the case where two switching elements 2 are arranged side by side, the current path is divided into two paths, and the two current paths are wired to the respective two switching elements 2, the wiring of the two current paths tends to be symmetrical and equal in length. Therefore, when three or more switching elements 2 are connected in parallel, it is more difficult to equalize the currents flowing to the switching elements 2 than when two switching elements 2 are connected in parallel.

If the switching element has a shape for a module type for high current applications, a metal plate may be used for the wiring and bolted to the switching element. When three or more switching elements are connected in parallel using metal plates, the wiring length in the current path of each switching element depends on the physical arrangement.

For example, a description will be made using a comparative example shown in FIG. 5A. In the comparative example, three switching elements 2 arranged side by side are connected by terminal holes 5t2C at the lower end of a metal conductor 5C corresponding to the P-pole connection conductor 5 of the present application, and are electrically connected to the outside through a terminal hole 5t1C (corresponding to the first terminal hole 5t1 of the present application and the branch point Ps in FIG. 4) at the upper end central portion. Note that the corresponding portions of the comparative example to those in the embodiment are distinguished by adding "C" to the end of the reference numerals. In this case, the wiring length varies depending on the positional relationship between the arrangement of the switching elements 2 and the terminal hole 5t1C, and a wiring length L2C becomes short (mismatch) relative to wiring lengths L1C and L3C, and the current flowing to each switching element 2 cannot be equalized.

In contrast, in the power conversion device 9 of the present application, as shown in FIG. 5B, an opening (slit 5s) is provided in the metal plate (P-pole connection conductor 5) to be connected to three or more switching elements 2. Although not specified, the slit 5s serves as an insulating portion of air or the like, and a current path from the first terminal hole 5t1 to each switching element 2 (second terminal holes 5t2) is formed so as to avoid the slit 5s. As a result, a wiring length L1 (=Lm+Ls1) to the switching element 2 on the outer side is equal to a wiring length L2 (=Lm+Ls2) to the switching element 2 in the center. This also applies to the N-pole connection conductor 6 provided with the slit 6s.

Therefore, among the variations in the currents flowing through the switching elements 2, the variation caused by the difference in the wiring length is to be suppressed. The method of providing an opening such as the slit 5s in the metal plate can be performed by a typical method such as press working or laser-beam machining. In the metal plates (the P-pole connection conductor 5 and the N-pole connection conductor 6) used for connecting the switching elements 2 connected in parallel in this way, current equalization is achieved by simple processing such as providing the opening (slit 5s, slit 6s).

The current equalization of each switching element 2 provides an effect of uniformly improving a current utilization factor of each switching element 2. Here, the current utilization factor is a ratio when the rated current value of the switching element 2 is used as a denominator and the maximum flowing current value is used as a numerator. When the currents of the switching elements 2 are not uniform, the current utilization factor of the switching element 2 through which the current flows most easily is restricted so as not to exceed 1. As a result, the current utilization factor of the switching element 2 through which the current tends to flow less becomes lower than 1, which means that the switching element 2 is not fully utilized. In contrast, the equalization achieved by providing the opening allows for each switching element 2 to be fully utilized.

End Shape

As shown in FIG. 2, the AC-pole connection conductor 7 used in the power conversion device 9 of the present application has a shape in which two of the four corners of a rectangle are diagonally cut out. There are no conductors in the portions of the two corners cut from the rectangular conductor, so it is no longer a current path. The two corners cut out from the rectangular conductor are located closer to the two switching elements 2 that are located on the outer side among the three switching elements 2 than to the switching element 2 that are arranged in the center. Therefore, the cutting of the two corner portions from the rectangular conductor is likely to affect the ease of the current flow to the two switching elements 2 arranged on the outer side, and is unlikely to affect the ease of the current flow to the switching elements 2 arranged on the center. Therefore, by adjusting the shape in the cut portion of the corner with respect to the rectangular shape, that is, by narrowing the width of the end portion where the number of terminal holes formed is smaller, it is possible to adjust the ease of the current flow to the switching elements 2 on the outer side.

On the other hand, the opening (slits 5s, 6s) provided inside the rectangular shape make it difficult for the current of the switching element 2 at the center to flow. As described above, by combining the adjustment of the outer peripheral shape of the conductor used for the electrical connection and the adjustment of the shape of the opening provided inside, the ease of the current flow to each switching element 2 is adjusted. As a result, an effect of equalizing the current utilization factor of each switching element 2 is obtained.

Here, although the AC-pole connection conductor 7 is taken as an example, this is not limited to the AC-pole connection conductor 7. Although it has been described that the ease of the current flow to the switching element 2 is adjusted, it can also be used to adjust the ease of current flow to the capacitor 1. Although the shape in which the corner of the conductor is diagonally cut out is shown, the shape to be cut out is not limited to a triangle, and the same effect can be obtained by cutting it out in a square shape or other shape.

<Current Path to Capacitor>

In addition to the wiring lengths of the current paths between the branch point Ps and the switching elements as described above, as the current paths to the capacitors each of the positions of third ends in the P-pole connection conductor and the N-pole connection conductor will be described. In the P-pole connection conductor 5, the first terminal hole 5t1 connected to the electrode of the capacitor 1, the second terminal holes 5t2 connected to the switching elements 2, and the third terminal holes 5t3 connected to the outside are formed. A steep voltage change and a steep current change generated by the switching operation of the switching element 2 are absorbed by the smoothing action of the capacitor 1, which is a power storage element. In order for the smoothing action to be smoothly performed, it is necessary to lower the impedance of the current paths between the switching elements 2 and the capacitor 1.

However, in the third terminal holes 5*t*3 of the P-pole connection conductor 5 formed of the metal plate, since electrical connection is formed to a mounting hole by bolting, a contact resistance is generated. Therefore, it is desirable that positions of the third terminal holes 5*t*3 of the P-pole connection conductor 5 avoid paths connecting the first terminal hole 5*t*1 to the second terminal holes 5*t*2. In contrast, if the third terminal holes 5*t*3 of the P-pole connection conductor 5 are provided on the paths connecting the first terminal hole 5*t*1 to the second terminal holes 5*t*2, the steep voltage change and the steep current change generated by the switching operation are easily transferred to the outside through the third terminal holes 5*t*3. Note that, when the impedance formed by connection to the outside is sufficiently high, they are not transferred to the outside.

Therefore, in the P-pole connection conductor 5 of the power conversion device of the present application, the third terminal holes 5*t*3 are arranged so as to avoid the paths connecting the first terminal hole 5*t*1 to the second terminal holes 5*t*2, as shown in FIG. 6. Paths indicated by arrows P1 and P2 in FIG. 6 are those connecting the first terminal hole 5*t*1 to the second terminal holes 5*t*2. The third terminal holes 6*t*3 of the N-pole connection conductor 6 are also arranged so as to avoid the paths connecting the first terminal hole 6*t*1 to the second terminal holes 6*t*2, as in the case of the P-pole connection conductor 5. By thus setting the positions of the third terminal holes 5*t*3 and 6*t*3, it is possible to stabilize the switching operation of the power conversion device 9.

<Wiring Member Between Unit-Converters>

In addition to the current paths in the P-pole connection conductor and the N-pole connection conductor in the unit-converter described above, an electrical connection method for forming a current path between the unit-converters will be described. In the P-pole connection conductor 5, two third terminal holes 5*t*3, which are arranged in consideration of the positional relationship between the first terminal hole 5*t*1 and the second terminal holes 5*t*2 described above and are used for connecting the unit-converter 3 to the outside, are provided on the side of a portion 51 (FIG. 3A) where the first terminal hole 5*t*1 is formed. Similarly, in the N-pole connection conductor 6, two third terminal holes 6*t*3, which are arranged in consideration of the positional relationship between the first terminal hole 6*t*1 and the second terminal holes 6*t*2 described above and are used for connecting the unit-converter 3 to the outside, are provided on the side of a portion 61 (FIG. 3B) where the first terminal hole 6*t*1 is formed.

The two third terminal holes 5*t*3 of the P-pole connection conductor 5 extend toward a side of a portion 52 (downward direction in FIG. 3A), and are arranged at positions symmetrical with respect to the center of the P-pole connection conductor 5 (in the left-right direction in the same figure (direction in which the bent portion 5*b* extends)). Similarly, the two third terminal holes 6*t*3 of the N-pole connection conductor 6 also extend toward a side of a portion 62 (downward direction in FIG. 3B), and are arranged at positions symmetrical with respect to the center of the N-pole connection conductor 6 in the left-right direction (in the left-right direction in the same figure (direction in which the bent portion 6*b* extends)).

When incorporated into the unit-converter 3, as shown in FIG. 7A and FIG. 7B, the third terminal holes 5*t*3 of the P-pole connection conductor 5 and the third terminal holes 6*t*3 of the N-pole connection conductor 6 are placed into two positions apart in the unit-converter 3 and arranged adjacent to each other in the left-right direction at each position. At this time, as described above, since the third terminal holes 5*t*3 are disposed at positions symmetrical (equidistant) with respect to the center, when the switching elements 2 of the two unit-converters 3 are disposed so as to be opposed to each other, two tip portions of the third terminal holes 5*t*3 in the respective P-pole connection conductors 5 come close to each other in the extending direction. Similarly, two tip portions of the third terminal holes 6*t*3 of the respective N-pole connection conductors 6 come close to each other in the extending direction.

Further, the third terminal holes 5*t*3 of the P-pole connection conductor 5 and the third terminal holes 6*t*3 of the N-pole connection conductor 6 in the unit-converter 3 are provided at positions adjacent to each other in the left-right direction as described above. Therefore, the third terminal holes 5*t*3 of the P-pole connection conductors 5 facing each other is located close to each other and the third terminal holes 6*t*3 of the N-pole connection conductors 6 facing each other is located close to each other in the two unit-converters 3 incorporated as the power conversion device 9. Therefore, the connection between the two unit-converters 3 can be made with short wiring.

The connection between the third terminal holes 5*t*3 of the P-pole connection conductor 5 to each other and the third terminal holes 6*t*3 of the N-pole connection conductor 6 to each other in the two unit-converters 3 can be achieved, for example, with a wiring member 10 in a linear shape having terminal holes 10*t* formed at both ends, as shown in FIG. 8A. The connection between the third terminal holes 5*t*3 of the P-pole connection conductor 5 of one unit-converter 3 and the third terminal holes 6*t*3 of the N-pole connection conductors 6 of the other unit-converter 3 can be achieved with an L-shaped wiring member 10 as shown in FIG. 8B or an S-shaped wiring member 10 as shown in FIG. 8C. As described above, the two unit-converters 3 are connected using the wiring member 10 for the connection, and can be connected in series or in parallel by selecting the shape of the wiring member 10. Only by selecting the shape of the wiring member 10 for the connection, a serial connection application and a parallel connection application can be easily selected.

<Component Sharing>

Further, in the power conversion device 9 of the present application, the two unit-converters 3 constituting the power conversion device 9 have the same shape in the P-pole connection conductors 5 and the same shape in the N-pole connection conductors 6 for component sharing. That is, the two unit-converters 3 constituting the power conversion device 9 each use the P-pole connection conductor 5 having the same shape (FIG. 3A) and the N-pole connection conductor 6 having the same shape (FIG. 3B).

As a result, the P-pole connection conductor 5 and the N-pole connection conductor 6 each in the two unit-converters 3 constituting the power conversion device 9 can be made common. Therefore, it is possible to obtain effects such as a reduction in the number of component manufacturing lines by the component sharing and simplification of the manufacturing of the power conversion device 9.

Variation

Figure 9:
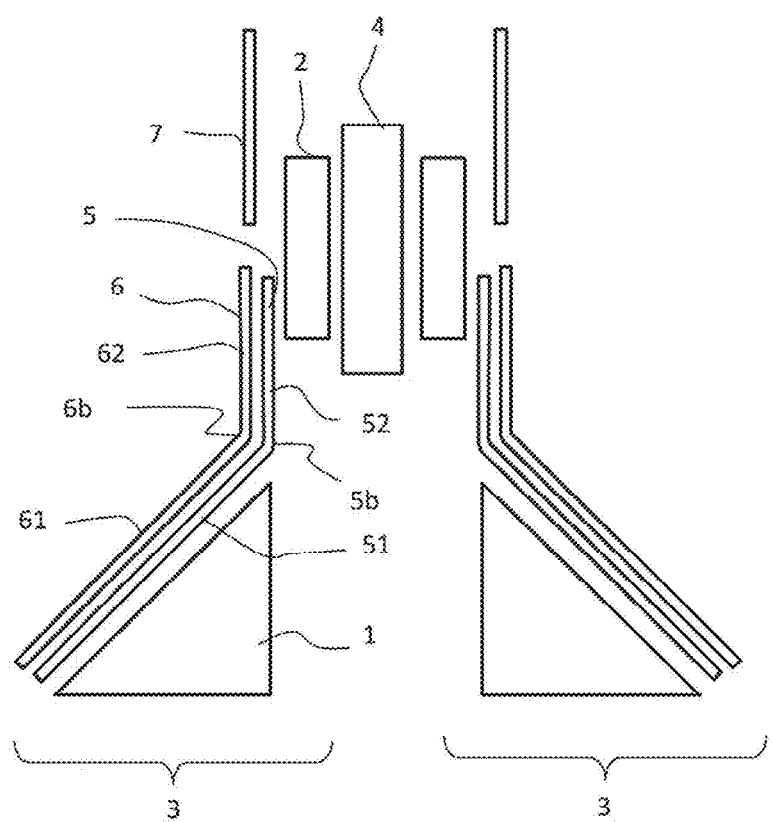
FIG. 9 is a schematic side view for describing a configuration of a power conversion device according to a variation of Embodiment 1.

In the example described above, the capacitor has a cubic shape, and the P-pole connection conductor and the N-pole connection conductor are provided with the bent portions of 90 degrees. In the present variation, a case where a capacitor having a triangular prism shape is used will be described. FIG. 9 is a schematic side view for describing a configuration of a power conversion device according to the present variation. The configuration other than the shapes of the P-pole connection conductor and the N-pole connection conductor in accordance with the shape of the capacitor is basically the same as that of the above-described embodiment, and the description of the same portions will be omitted.

In the power conversion device 9 according to the present variation, the capacitor 1 having a triangular prismatic shape is used and is mounted such that the axes of the column are set parallel to a mounting surface (for example, the surface on which the first terminal hole 5t1 is formed) and a certain side surface faces the mounting surface, instead of the end surfaces of the column such as the top surface and the bottom surface. In this case, as shown in FIG. 9, the P-pole connection conductor 5 and the N-pole connection conductor 6 are formed with bent portions 5b and 6b, which are bent in an angle range of more than 0 degree and less than 90 degrees in accordance with the angle of a corner of the triangular prism. Thus, the capacitor 1 can be placed on the front side relative to the switching element 2 in each of the unit-converters 3 (for example, on the portion 62 side relative to an extension line of the portion 52), and the switching elements 2 can be opposed to each other to share the cooling device 4.

In this case, portions for the third terminal holes 5t3 in the P-pole connection conductor 5 and the third terminal holes 6t3 in the N-pole connection conductor 6 in the two unit-converters 3 are bent to be perpendicular to the portions 52 and 62 in the middle so as not to extend in parallel to the portions 51 and 61, for example. In this way, two of the third terminal holes 5t3 of the respective P-pole connection conductors 5 in the two unit-converters 3 come close to each other in the extending direction. Similarly, two of the third terminal holes 6t3 of the respective N-pole connection conductors 6 come close to each other in the extending direction. As a result, the unit-converters 3 can be easily electrically connected to each other by the wiring member 10 described in FIG. 8A to FIG. 8C.

Alternatively, the portions for the third terminal holes 5t3 in the P-pole connection conductor 5 and the third terminal holes 6t3 in the N-pole connection conductor 6 of the two unit-converters 3 are left extending in parallel to the portions 51 and 61. Even in this case, for example, by bending the middle portion of the wiring member 10 described in FIG. 8A to FIG. 8C in the thickness-wise direction, electrical connection between the unit-converters 3 can be easily achieved.

Embodiment 2

Figure 10:
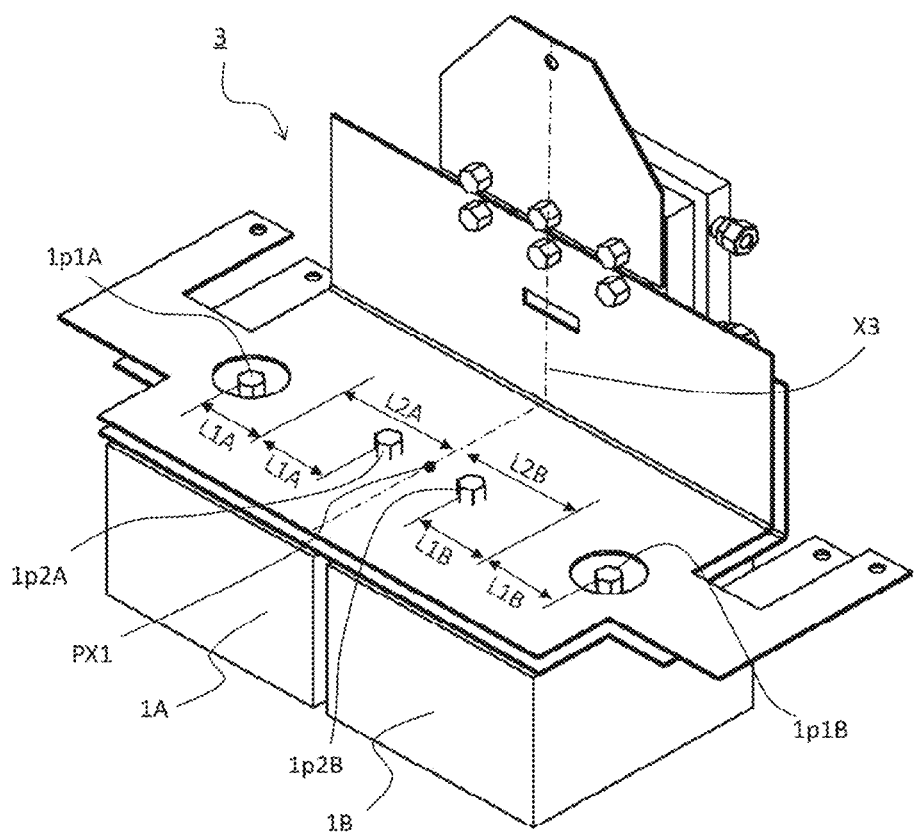
FIG. 10 is a perspective view for describing a configuration of a unit-converter of a power conversion device according to Embodiment 2.
Figure 11:
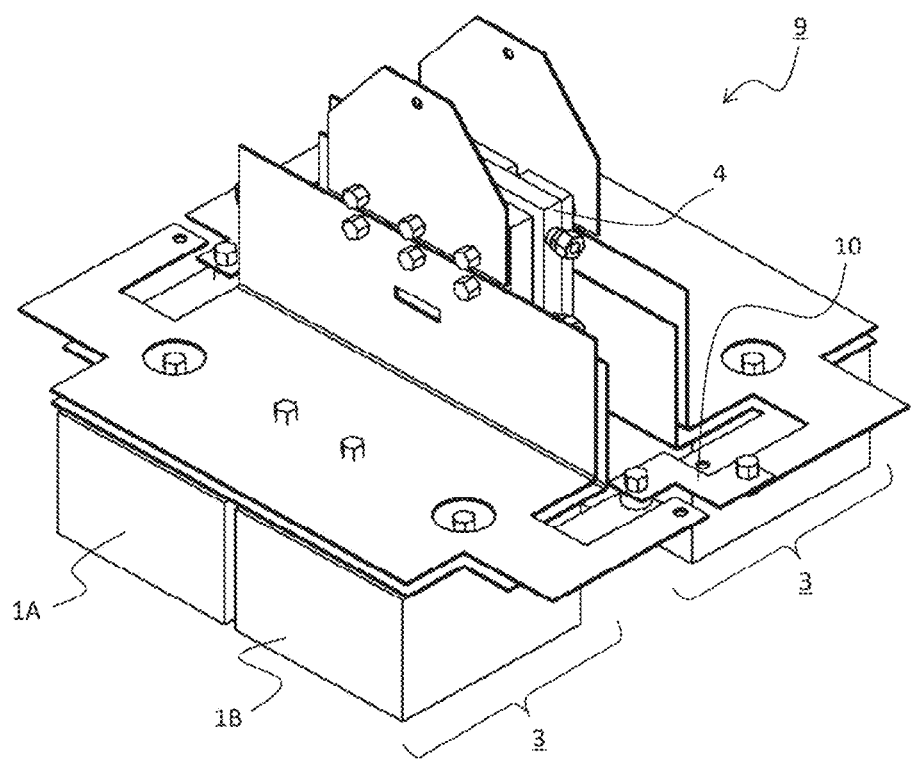
FIG. 11 is a perspective view for describing a configuration of the power conversion device according to Embodiment 2.

In Embodiment 1, the case where one capacitor is provided for each unit-converter has been described. In Embodiment 2, a case where a plurality of capacitors are provided for each unit-converter will be described. FIG. 10 and FIG. 11 are for describing a configuration and an operation of a power conversion device and the unit-converter according to Embodiment 2. FIG. 10 is a perspective view corresponding to FIG. 2 for describing a configuration of the unit-converter of the power conversion device, and FIG. 11 is a perspective view corresponding to FIG. 1A for describing the configuration of the power conversion device. The configuration other than the shapes of the P-pole connection conductor and the N-pole connection conductor in accordance with an arrangement of the capacitors is basically the same as those of the above-described embodiment, and the description of the same portions will be omitted, and FIG. 1B, FIG. 4, and FIG. 9, etc., used in Embodiment 1 will be referred to.

In the power conversion device 9 according to Embodiment 2, as shown in FIG. 10, two capacitors 1 having the same specifications (when two capacitors are distinguished from each other, one capacitor 1 is referred to as a capacitor 1A, and the other capacitor 1 is referred to as a capacitor 1B) are provided in the unit-converter 3. The two capacitors 1 are arranged symmetrically with respect to a plane including a center line X3 in the left-right direction of the unit-converter 3. Then, a center position PX1 (a distance L2A coincides with a distance L2B) between the center position between a P-pole terminal 1p1A and a N-pole terminal 1p2A in the capacitor 1A (equally divided by a distance L1A) and the center position between a P-pole terminal 1p1B and a N-pole terminal 1p2B in the capacitor 1B (equally divided by a distance L1B) is located on the center line X3.

Note that, in the unit-converter 3 including a single capacitor 1, the center position PX1 between the P-pole terminal 1p1 and the N-pole terminal 1p2 is on the center line X3 because the capacitor 1 is placed on the center line X3. Therefore, current paths between a capacitor 1 and the switching elements 2 are equivalent between the unit-converter 3 including the two capacitors 1A and 1B and the unit-converter 3 including the single capacitor 1. Note that, when the unit-converters 3 each including the two capacitors 1A and 1B and the shared cooling device 4 are combined, a power conversion device 9 as shown in FIG. 11 is obtained.

Embodiment 3

Figure 12:
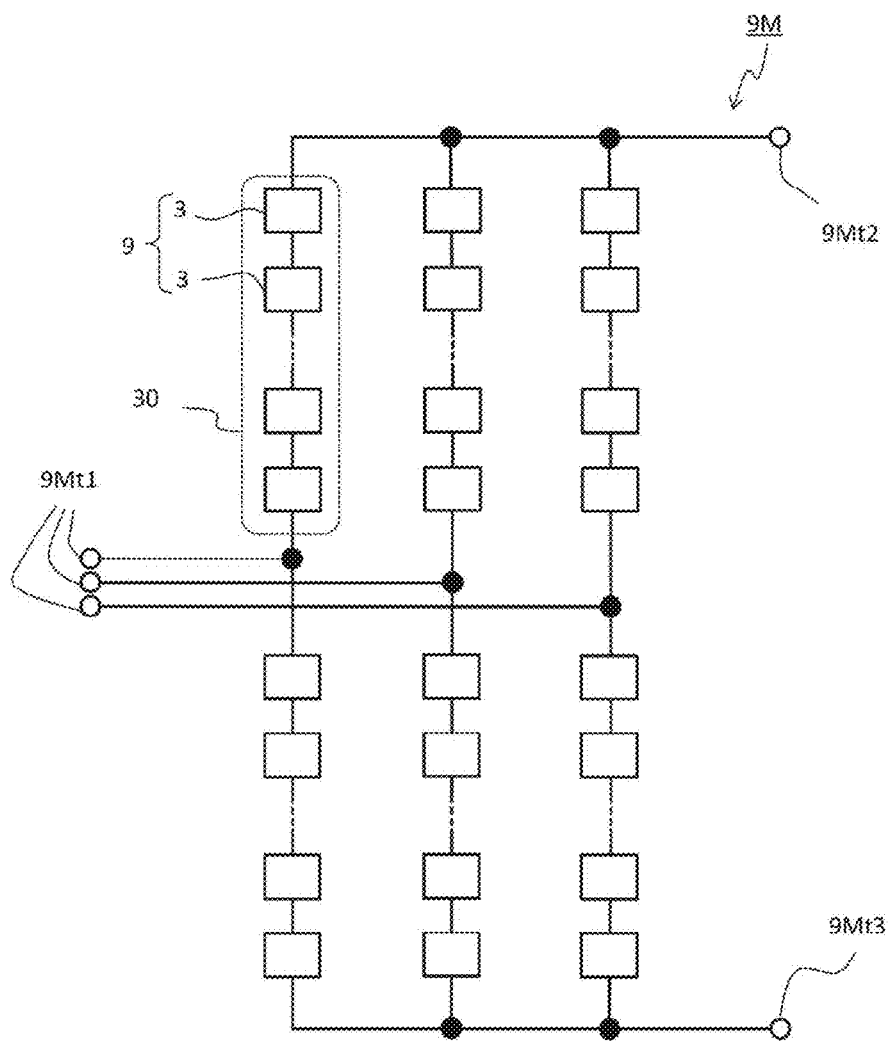
FIG. 12 is a schematic circuit diagram for describing a configuration of a power conversion device of an MMC system according to Embodiment 3.
Figure 13:
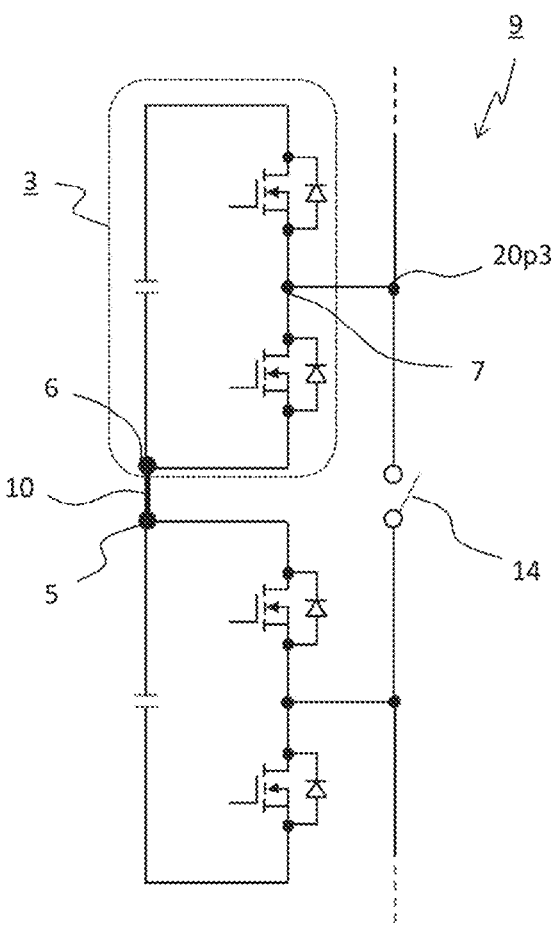
FIG. 13 is a schematic circuit diagram for describing a configuration of the power conversion device according to Embodiment 3.

In Embodiment 3, for a power conversion device in which one cooling device is shared and two unit-converters are combined, which is described in each of the above-described embodiments, an example provided with a bypass switch serving as a device protection means and an MMC combined with those described above will be described. FIG. 12 to FIG. 15 are diagrams for describing configurations and an operation of a power conversion device and an unit-converter according to Embodiment 3, FIG. 12 is a schematic circuit diagram for describing a configuration of a power conversion device of an MMC system, and FIG. 13 is a schematic circuit diagram of a power conversion device including a bypass mechanism suitable for the MMC system.

Figure 14:
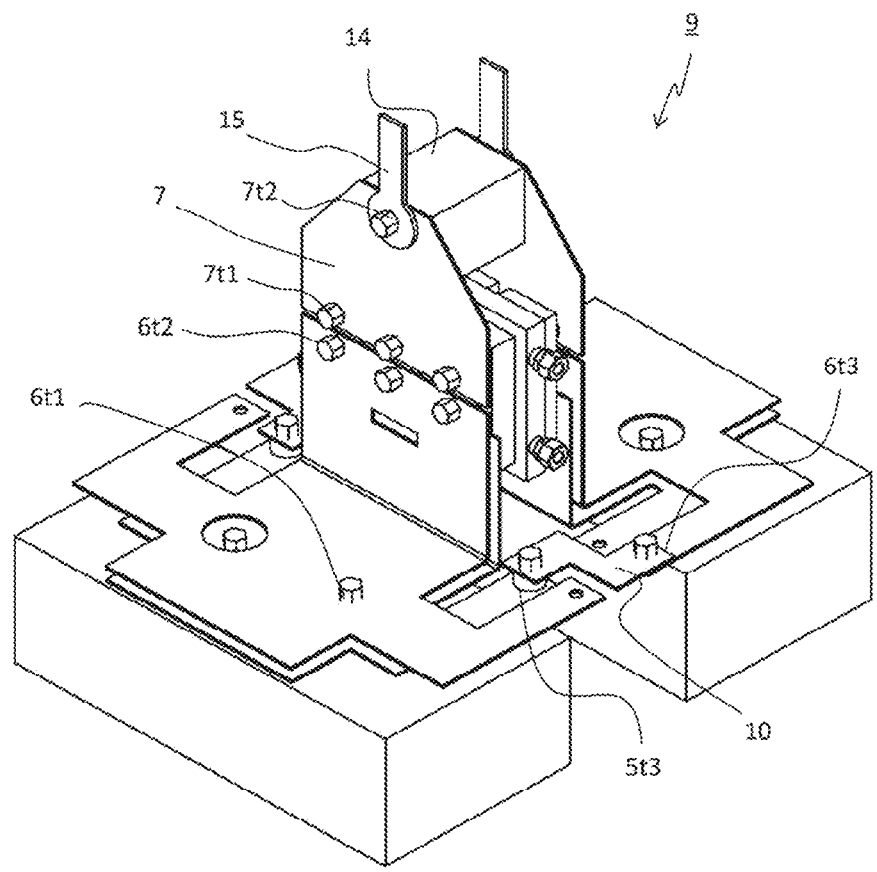
FIG. 14 is a perspective view for describing a configuration of the power conversion device according to Embodiment 3.
Figure 15:
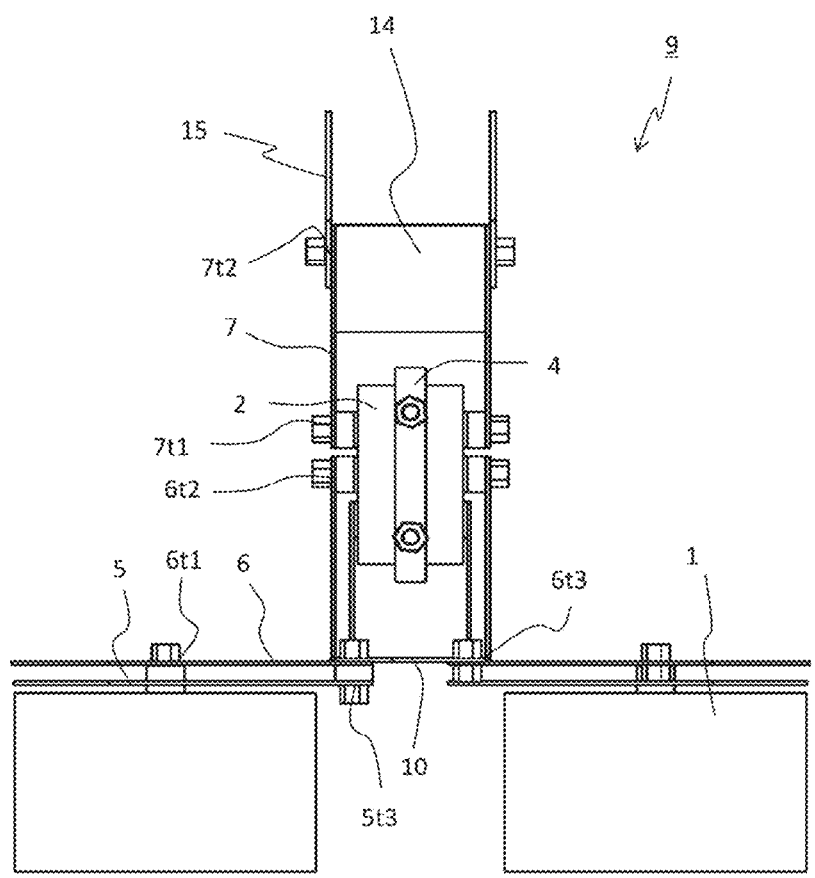
FIG. 15 is a side view for describing the configuration of the power conversion device according to Embodiment 3.

FIG. 14 is a perspective view of the power conversion device including the bypass mechanism, corresponding to FIG. 1A, and FIG. 15 is a side view of the power conversion device including the bypass mechanism. Note that the configuration except that the bypass mechanism is provided is basically the same as in Embodiment 1 and Embodiment 2 described above, and the description of the same portions will be omitted, and FIG. 2 to FIG. 11 used in Embodiment 1 or Embodiment 2 will be referred to.

As shown in FIG. 13, the power conversion device 9 according to Embodiment 3 is configured such that the AC-poles 20p3 of two unit-converters 3 are connected to each other via a bypass switch 14. The N-pole connection conductor 6 of one unit-converter 3 and the P-pole connection conductor 5 of the other unit-converter 3 are connected with the wiring member 10 described in Embodiment 1. The unit-converters 3 of the power conversion device 9 having the bypass switch 14 is used as a cell, and a P-pole connection conductor 5 of a unit-converter 3 on the P-pole side of a certain power conversion device is connected to an N-pole connection conductor 6 of a unit-converter 3 on the N-pole side of an adjacent power conversion device 9. Then, as shown in FIG. 12, an arm 30 in which cells of a plurality of the power conversion devices 9 are connected in series is formed, and a power conversion device 9M of the MMC system is formed.

The power conversion device 9M of the MMC system includes a plurality of the arms 30, and the arms 30 are divided into first arms 30 connected to a positive voltage terminal 9Mt2 side and second arms 30 connected to a negative voltage terminal 9Mt3 side, and places where the first arms 30 and the second arms 30 are connected to each other are AC terminals 9Mt1.

At this time, when a specific power conversion device 9 is brought into a disabled condition of an energization operation due to occurrence of an anomaly or the like, the power conversion device 9 brought into the disabled condition of the energization operation is bypassed in order to continue the operation in the entire power conversion device 9M of the MMC system. An example of the bypass mechanism is the bypass switch 14. As another example, an element that is to be short-circuited by application of a voltage equal to or higher than a predetermined voltage may be used. Or in a case where a short-circuit accident occurs outside a power conversion device 9, the power conversion device 9 concerned is bypassed in order to avoid a failure caused by an overcurrent flowing through the power conversion device 9. An example of the bypass mechanism in this case is a commutation diode or a bypass switch.

Then, in the power conversion device 9 according to the present embodiment, by bypassing between the AC-poles 20$p$3 of the two respective unit-converters 3, it is possible to bypass their own unit-converters 3 when the power conversion device 9 is brought into a disabled condition of the energization operation. In addition, for example, when a rectangular parallelepiped bypass switch 14 is used as the bypass mechanism, as shown in FIG. 14 and FIG. 15, the bypass switch 14 can be fixed in a form interposed between the AC-pole connection conductors 7 of the two respective unit-converters 3.

The bypass mechanism is fixed by a mechanism such as a bolt together with an external connection wire 15 connected to the second terminal hole 7$t$2 of the AC-pole connection conductor 7. That is, since the unit-converters 3 are configured such that the capacitors 1 do not protrude in front of the switching element 2, the single bypass switch 14 can be shared by the two unit-converters 3 as in the cooling device 4.

As a result, the number of bypass mechanisms required in the entire power conversion device 9M of the MMC system can be reduced by half as compared with the case where one bypass mechanism is provided for each of the unit-converters 3. Further, by fixing the bypass mechanism (bypass switch 14) and the external connection wire 15 by a common mechanism, the number of structural components can be reduced.

Although various exemplary embodiments and examples are described in the present application, various features, aspects, and functions described in one or more embodiments are not inherent in an application of the contents disclosed in a particular embodiment, and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with a component disclosed in another embodiment are included.

For example, the positional relationship between the switching element 2 and the capacitor 1 is not limited to the exemplified embodiments, and the capacitors 1 for the pair of unit-converters 3 may be integrally provided as long as the cooling device 4 is shared. In addition, the shapes, etc., of the capacitor 1, the P-pole connection conductor 5, and the N-pole connection conductor 6 can be variously modified.

As described above, the power conversion device 9 in the present application includes the pair of unit-converters 3, and the cooling device 4. Each of the pair of unit-converters 3 includes the capacitor 1, the switching element 2 in which the cooling surface and the connecting surface opposite to the cooling surface are provided and two electrodes through which main power flows are formed in the connecting surface and by which the leg 20 for the power conversion is formed by forming a pair, the first conductive plate (for example, P-pole connection conductor 5) in which the second terminal hole 5$t$2 is formed at one end for fixing an electrode of the switching elements 2 forming the pair, the electrode corresponding to the first pole (for example, P-pole 20$p$1) in the leg 20, and the first terminal hole 5$t$1 is formed at the other end for fixing the electrode (terminal 1$p$1) of the capacitor 1 corresponding to the first pole (P-pole 20$p$1), and the second conductive plate (for example, N-pole connection conductor 6) in which the second terminal hole 6$t$2 is formed at one end for fixing an electrode of the switching elements 2 forming the pair, the electrode corresponding to the second pole (for example, N-pole 20$p$2) in the leg 20, and the first terminal hole 6$t$1 is formed at the other end for fixing the electrode (terminal 1$p$2) of the capacitor 1 corresponding to the second pole (N-pole 20$p$2), the second conductive plate being arranged to overlap with the first conductive plate (P-pole connection conductor 5) in the thickness direction, maintaining insulation from the first conductive plate. In the pair of unit-converters 3, the cooling surfaces of the switching elements 2 forming the pair in one unit-converter 3 is opposed to the cooling surfaces of the switching elements 2 forming the pair in the other unit-converter 3 with the cooling device 4 interposed therebetween. That is, the power conversion device 9 is configured such that the cooling surfaces of the switching elements 2 are opposed to each other with the single cooling device 4 interposed (shared) therebetween. Therefore, the number of components is reduced, and it is possible to obtain a compact power conversion device 9.

At this time, each of the pair of unit-converters 3 is configured such that the capacitor 1 is placed on the front side relative to the cooling surface of the switching element 2 in a direction away from the second terminal hole 5$t$2 (and the second terminal hole 6$t$2). Therefore, the capacitors 1 do not interfere with each other, (the flat surfaces of) the switching elements 2 are opposed to each other, and the power conversion device 9 can be configured by interposing (sharing) one cooling device 4.

In particular, the first conductive plate (P-pole connection conductor 5) and the second conductive plate (N-pole connection conductor 6) each are formed with the bent portion (bent portions 5$b$, 6$b$) in the middle portion so as to have an angle between the portion (portions 51, 61) where the first terminal hole (5$t$1, 6$t$1) is formed and the portion (portions 52, 62) where the second terminal hole (5$t$2, 6$t$2) is formed. Therefore, the capacitor 1, which is bulkier than the switching element 2, can be easily placed on the front side.

When the pair of unit-converters 3 are configured such that the first conductive plates (P-pole connection conductor 5) have the same shape and the second conductive plates (N-pole connection conductor 6) have the same shape to each other, the productivity is further improved by the component sharing.

When each of the first conductive plate (P-pole connection conductor 5) and the second conductive plate (N-pole connection conductor 6) is configured such that three or more of the second terminal holes (5$t$2, 6$t$2) are arranged along the one end, and the opening (slits 5$s$, 6$s$) is formed on the line connecting a centrally arranged terminal hole thereof and the first terminal hole (5$t$1, 6$t$1), the length L2 (=Lm+Ls2) of the current paths between the switching element 2 connected to the central terminal hole and the capacitor 1 and the length L1 (=Lm+Ls1) of the current paths between the switching element 2 connected to the outer terminal hole and the capacitor 1 are adjusted to be equal by the position and size of the opening, and thus the current utilization factor of each of the switching elements 2 connected in parallel can be uniformly improved.

The first conductive plate (P-pole connection conductor 5) and the second conductive plate (N-pole connection conductor 6) are respectively provided with third contact holes 5$t$2 and 6$t$2 for electrical connection to the outside at positions away from the shortest paths (current paths 5$t$1 and 6$t$1) connecting the second contact holes P1 and P2 and the first contact holes 5$t$3 and 6$t$3.

In one of the first conductive plate (P-pole connection conductor 5), the second conductive plate (N-pole connection conductor 6), and the third conductive plate (AC-pole connection conductor) whose one end is formed with a terminal hole (first terminal hole 7$t$1) corresponding to the AC pole (AC-pole 20$p$3) in the leg 20 and whose other end is formed with a terminal hole (second terminal hole 7$t$2) for electrical connection to the outside, when the number of terminal holes formed at one end portion is larger than the number of terminal holes formed at the other end portion and the width of the other end portion is narrower than the width of the one end portion, the length of the current paths from the elements connected in parallel through the conductor plate concerned can be equalized.

In particular, by providing the bypass mechanism (bypass switch 14) that bypasses between the pair of unit-converters 3, it is possible to form a power conversion device 9 of the MMC system that can operate normally even if an anomaly occurs in a specific power conversion device 9.

DESCRIPTION OF REFERENCE NUMERALS AND SIGNS

1: capacitor, 1$p$1: (P-pole) terminal, 1$p$2: (N-pole) terminal, 2: switching element, 20: leg, 20$p$1: P-pole, 20$p$2: N-pole, 20$p$3: AC-pole, 3: unit-converter, 30: arm, 4: cooling device, 4$v$: water-cooled valve port, 4$s$: structural component, 5: P-pole connection conductor (first conductive plate), 5$s$: slit (opening), 5$t$1: first terminal hole, 5$t$2: second terminal hole, 5$t$3: third terminal hole, 6: N-pole connection conductor (second conductive plate), 6$s$: slit (opening), 6$t$1: first terminal hole, 6$t$2: second terminal hole, 6$t$3: third terminal hole, 7: AC-pole connection conductor (third conductive plate), 7$t$1: first terminal hole, 9: power conversion device, 9M: power conversion device, 9Mt1: AC terminal, 9Mt2: positive voltage terminal, 9Mt3: negative voltage terminal, 10: wiring member, 14: bypass switch (bypass mechanism), 15: external connection wire.

The invention claimed is:

1. A power conversion device comprising:
a pair of unit-converters; and
a cooling device, wherein
each of the pair of unit-converters comprises:
a capacitor;
a switching element in which a cooling surface and a connecting surface opposite to the cooling surface are provided and two electrodes through which main power flows are formed in the connecting surface and by which a leg for power conversion is formed by forming a pair;
a first conductive plate in which a second terminal hole is formed at one end for fixing an electrode of the switching elements forming the pair, the electrode corresponding to a first pole in the leg, and a first terminal hole is formed at the other end for fixing an electrode of the capacitor corresponding to the first pole; and
a second conductive plate in which a second terminal hole is formed at one end for fixing an electrode of the switching elements forming the pair, the electrode corresponding to a second pole in the leg, and a first terminal hole is formed at the other end for fixing an electrode of the capacitor corresponding to the second pole, the second conductive plate being arranged to overlap with the first conductive plate in a thickness direction, maintaining insulation from the first conductive plate, wherein,
in the pair of unit-converters, the cooling surfaces of the switching elements forming the pair in one unit-converter is opposed to the cooling surfaces of the switching elements forming the pair in the other unit-converter with the cooling device interposed therebetween.

2. The power conversion device according to claim 1, wherein, in each of the pair of unit-converters, the capacitor is placed on a front side relative to the cooling surface of the switching element in a direction away from the second terminal hole.

3. The power conversion device according to claim 1, wherein the first conductive plate and the second conductive plate each have a bent portion in a middle portion so as to have an angle between a portion where the first terminal hole is formed and a portion where the second terminal hole is formed.

4. The power conversion device according to claim 2, wherein the first conductive plate and the second conductive plate each have a bent portion in a middle portion so as to have an angle between a portion where the first terminal hole is formed and a portion where the second terminal hole is formed.

5. The power conversion device according to claim 1, wherein the pair of unit-converters are such that the first conductive plates have the same shape to each other and the second conductive plates have the same shape to each other.

6. The power conversion device according to claim 2, wherein the pair of unit-converters are such that the first conductive plates have the same shape to each other and the second conductive plates have the same shape to each other.

7. The power conversion device according to claim 1, wherein three or more of the second terminal holes are arranged along the one end of each of the first conductive plate and the second conductive plate, and an opening is formed on a line connecting a centrally arranged terminal hole thereof and the first terminal hole.

8. The power conversion device according to claim 2, wherein three or more of the second terminal holes are arranged along the one end of each of the first conductive plate and the second conductive plate, and an opening is formed on a line connecting a centrally arranged terminal hole thereof and the first terminal hole.

9. The power conversion device according to claim 1, wherein a third terminal hole for electrical connection with an outside is formed in each of the first conductive plate and the second conductive plate at a position away from a shortest path connecting the second terminal hole and the first terminal hole.

10. The power conversion device according to claim 2, wherein a third terminal hole for electrical connection with an outside is formed in each of the first conductive plate and the second conductive plate at a position away from a shortest path connecting the second terminal hole and the first terminal hole.

11. The power conversion device according to claim 9, further comprising a wiring member that connects a terminal hole formed in the first conductive plate of the one unit-converter and a terminal hole formed in the first conductive plate of the other unit-converter among the third terminal holes.

12. The power conversion device according to claim 10, further comprising a wiring member that connects a terminal hole formed in the first conductive plate of the one unit-converter and a terminal hole formed in the first conductive plate of the other unit-converter among the third terminal holes.

13. The power conversion device according to claim 9, further comprising a wiring member that connects a terminal hole formed in the first conductive plate of the one unit-converter and a terminal hole formed in the second conductive plate of the other unit-converter among the third terminal holes.

14. The power conversion device according to claim 10, further comprising a wiring member that connects a terminal hole formed in the first conductive plate of the one unit-converter and a terminal hole formed in the second conductive plate of the other unit-converter among the third terminal holes.

15. The power conversion device according to claim 1, wherein, in one of the first conductive plate, the second conductive plate, and a third conductive plate whose one end is formed with a terminal hole corresponding to an AC pole in the leg and whose other end is formed with a terminal hole for electrical connection to an outside, the number of terminal holes formed at one end portion is larger than the number of terminal holes formed at the other end portion, and a width of the other end portion is narrower than a width of the one end portion.

16. The power conversion device according to claim 2, wherein, in one of the first conductive plate, the second conductive plate, and a third conductive plate whose one end is formed with a terminal hole corresponding to an AC pole in the leg and whose other end is formed with a terminal hole for electrical connection to an outside, the number of terminal holes formed at one end portion is larger than the number of terminal holes formed at the other end portion, and a width of the other end portion is narrower than a width of the one end portion.

17. The power conversion device according to claim 1, wherein, a bypass switch for bypassing between the pair of unit-converters is provided.

18. The power conversion device according to claim 2, wherein, a bypass switch for bypassing between the pair of unit-converters is provided.

19. The power conversion device according to claim 3, wherein, a bypass switch for bypassing between the pair of unit-converters is provided.

20. The power conversion device according to claim 5, wherein, a bypass switch for bypassing between the pair of unit-converters is provided.

* * * * *